United States Patent
Liu et al.

(10) Patent No.: US 8,019,022 B2
(45) Date of Patent: Sep. 13, 2011

(54) JITTER-TOLERANCE-ENHANCED CDR USING A GDCO-BASED PHASE DETECTOR

(75) Inventors: Shen-luan Liu, Taipei (TW); Che-Fu Liang, Taipei County (TW); Sy-Chyuan Hwu, Taipei (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 811 days.

(21) Appl. No.: 12/025,073

(22) Filed: Feb. 4, 2008

(65) Prior Publication Data

US 2008/0232524 A1 Sep. 25, 2008

Related U.S. Application Data

(60) Provisional application No. 60/896,289, filed on Mar. 22, 2007.

(51) Int. Cl.
*H04L 27/00* (2006.01)

(52) U.S. Cl. ......................................... 375/326

(58) Field of Classification Search ................... 375/326
See application file for complete search history.

(56) References Cited

U.S. PATENT DOCUMENTS

| | | | |
|---|---|---|---|
| 5,301,196 A * | 4/1994 | Ewen et al. ................ 370/518 |
| 6,686,777 B1 * | 2/2004 | Karlquist ........................ 327/2 |
| 7,734,000 B2 | 6/2010 | Kuo et al. |
| 2001/0017557 A1 * | 8/2001 | Friedrich et al. ............... 327/155 |
| 2002/0021470 A1 * | 2/2002 | Savoj ............................ 359/158 |

FOREIGN PATENT DOCUMENTS

TW I277302 3/2007

OTHER PUBLICATIONS

English language translation of abstract of TW I277302 (published Mar. 21, 2007).

* cited by examiner

*Primary Examiner* — Kevin Kim

(74) *Attorney, Agent, or Firm* — Thomas|Kayden

(57) ABSTRACT

An embodiment of a clock and data recovery circuit comprising a first clock and data recovery circuit with high bandwidth and a second clock and data recovery circuit with low bandwidth is disclosed. The first clock and data recovery circuit with high bandwidth receives a data signal and a reference signal to demux the data signal into a first signal and a second signal, wherein a second data rate X bps of the first signal and the second signal is half of a first data rate of the data signal. The second clock and data recovery circuit with low bandwidth receives and reduces jitter in the first signal and the second signal to output a first recovery signal and a second recovery signal.

23 Claims, 14 Drawing Sheets

US 8,019,022 B2

JITTER-TOLERANCE-ENHANCED CDR USING A GDCO-BASED PHASE DETECTOR

BACKGROUND OF THE INVENTION

1. Field of the Invention

The invention relates to a clock and data recovery circuit, and more particularly to a jitter-tolerance-enhanced clock and data recovery circuit using a GDCO-based phase detector.

2. Description of the Related Art

Jitter tolerance refers to the maximum amplitude of sinusoidal jitter (as a function of frequency) that can be tolerated without incorrect recovered data. A conventional phase-tracking clock and data recovery (CDR) circuit has a jitter tolerance inversely proportional to the jitter frequency, thus it is necessary to increase the CDR's loop bandwidth by changing the values of loop parameters to accommodate more high-frequency jitter. However, this might increase jitter transfer and may not be accepted in some applications, such as data repeaters. The trade-off between jitter transfer and jitter tolerance narrow the design margin and some non-idealities, such as non-linearity and the sampling offset, make the performance worse. In traditional optical receivers without jitter tolerance enhancement, the high-frequency jitter tolerance is difficult to exceed 0.5 UIpp (unit interval, peak-to-peak, which is 50% of the theoretical value). One of the remedies is to adopt an analog phase shifter such as a DLL into traditional CDRs. The DLL with wider bandwidth absorbs the jitter modulated on the incoming data and allows the main CDR to recover data correctly. This technique is effective; however, the power consumption and chip area increase.

BRIEF SUMMARY OF THE INVENTION

In one aspect of the invention, a clock and data recovery circuit comprising a first clock and data recovery circuit and a second clock and data recovery circuit is disclosed. The first clock and data recovery circuit with high bandwidth receives a data signal and a reference signal to demux the data signal into a first signal and a second signal, wherein the first signal and the second signal has a second data rate of X bps and the data signal has a first data rate of 2X bps. The second clock and data recovery circuit with low bandwidth receives and reduces jitter in the first signal and the second signal to output a first recovery signal and a second recovery signal, wherein the bandwidth of the first clock and data recovery circuit is larger than the bandwidth of the second clock and data recovery circuit.

In another aspect of the invention, a gated digital-controlled oscillator is disclosed. The gated digital-controlled oscillator comprises an en-oscillating unit, a first multiplexer, a second multiplexer and a third multiplexer. The en-oscillating unit receives an initial code to output a clock signal. The first multiplexer receives the initial code and comprises a first input terminal, a second input terminal and an output terminal coupled to the en-oscillating unit, wherein the output terminal outputs signal from the first input terminal or signal from the second input terminal based on a data signal. The second multiplexer comprises a third input terminal receiving an inverted clock signal, a fourth input terminal receiving the clock signal, and an output terminal coupled to the first input terminal of the first multiplexer, wherein the output terminal outputs signal from the third input terminal or signal from the fourth input terminal based on the data signal. The third multiplexer comprises a fifth input terminal receiving the clock signal, a sixth input terminal receiving the inverted clock signal, and an output terminal coupled to the second input terminal of the first multiplexer, wherein the output terminal outputs signal from the fifth input terminal or signal from the sixth input terminal based on the data signal.

In another aspect of the invention, clock and data recovery circuit receiving a data signal with a data rate of 2X bps is disclosed. The circuit comprises a first clock and data recovery circuit and a second clock and data recovery circuit. The first clock and data recovery circuit receives the data signal and an initial control code to separate the data signal into a first signal and a second signal. The first clock and data recovery circuit comprise a gated digital-controlled oscillator and a data separating unit. The gated digital-controlled oscillator receives the initial control code to generate a clock signal. The data separating unit separates the data signal into the first signal and the second signal based on the clock signal, wherein a second data rate of the first signal and the second signal is half of a first data rate of the data signal. The second clock and data recovery circuit receives and reduces jitter in the first signal and the second signal to output a first recovery signal and a second recovery signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Although theories for predicting the jitter transfer and jitter tolerance for a bang-bang CDR are available, however, the non-linearity and input-dependant jitter transfer makes the design harder, especially in applications which loop characteristics should be well-defined. To pass both jitter transfer and jitter tolerance masks, linear CDR architectures are widely used. Assuming the phase of input data and the phase of a conventional linear CDR's output is $\phi_D(s)$ and $\phi_{OUT}(s)$, respectively. Then the jitter transfer, H(s), and jitter tolerance, $J_{TOL}(s)$, may be represented in S-domain as $$H(s) = \frac{\phi_{OUT}(s)}{\phi_D(s)} \quad (5.1a)$$

$$J_{TOL}(s) = \frac{1}{1 - H(s)}(UIpp) \quad (5.1b)$$

where the UIpp in eq. (5.1b) means the peak-to-peak jitter amplitude normalized in unit interval. However, the representation of jitter tolerance in eq. (5.1b) is too optimistic because it assumes a linear CDR system under all conditions. Actually, conventional CDRs experience non-linearities and the gain of the CDR loop decreases. For example, due to the meta-stability of D flip-flops (DFFs), the phase detector experiences gain distortion when the phase error is large. In a conventional design, the simulated transfer curve of a linear half-rate phase detector has a limited linear range less than 0.8 UIpp. The gain of the phase detector decreases rapidly beyond this range. Furthermore, other non-idealities such as static sampling offset and duty-cycle distortion of the recovered clock decrease the jitter tolerance as well. Therefore, a CDR architecture which increases both the linear range and tolerable phase error between input data and the recovered clock is proposed. The basic idea of the present invention is to cascade two non-full-rate CDR circuits with different loop bandwidth and one embodiment of the clock and data recovery circuit is shown in FIG. 1.

Figure 1:
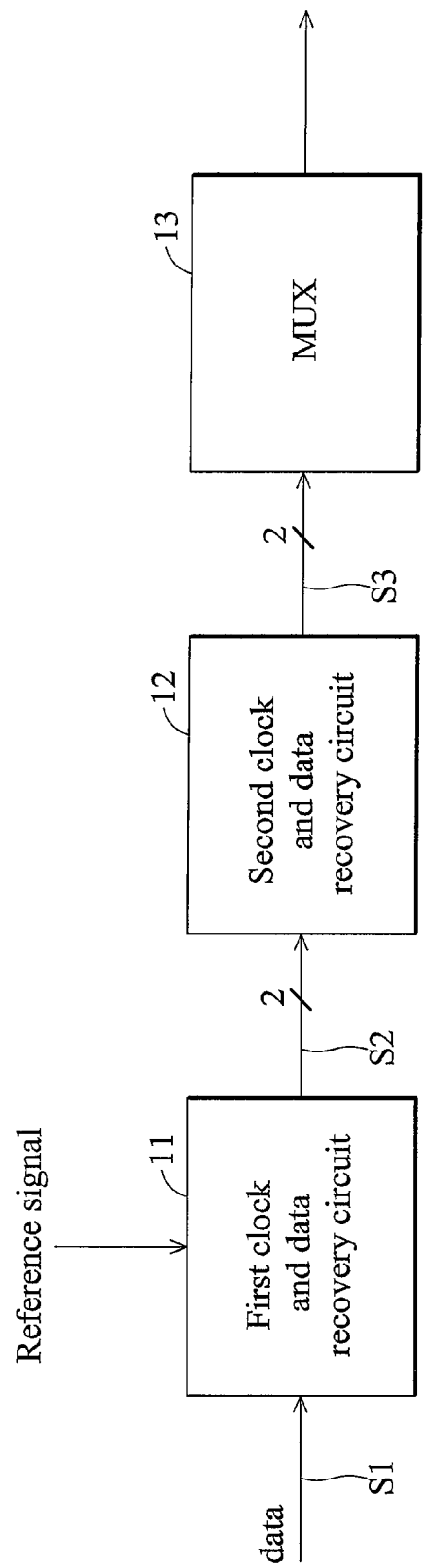
FIG. 1 is a block diagram of an embodiment of the clock and data recovery circuit according to the invention.

FIG. 1 is a block diagram of an embodiment of the clock and data recovery circuit according to the invention. The first clock and data recovery circuit (CDR) 11 has a high bandwidth and this means that the jitter of the data signal is substantially transferred to the second clock and data recovery (CDR) circuit 12. The first CDR circuit 11 receives and de-multiplexes the data signal into a first signal and a second signal based on a reference signal, wherein a second data rate X bps of the first and second signals is half of a first data rate of the data signal. In other words, the first CDR circuit 11 can be deemed an ideal multiplexer with nearly no disturbance on the jitter of the input data signal. The second CDR circuit 12 receives and reduces jitter in the first signal and the second signal to output a first recovery signal and a second recovery signal. In this embodiment, the bandwidth of the second CDR circuit 12 is smaller than the bandwidth of the first CDR circuit 11. The multiplexer 13 receives the first recovery signal and the second recovery signal to output a recovery data signal.

According to the architecture in FIG. 1, the linear range of the CDR circuit and the tolerable phase error between input data and recovered clock can be doubled. Assuming the jitter transfer of the first CDR circuit 11 ($CDR_{\_HBW}$) and the second CDR circuit 12 ($CDR_{\_LBW}$) is $H_{HBW}(s)$ and $H_{LBW}(s)$, respectively. The system's jitter transfer, $H_{SYS}(s)$, can be represented as following:

$$H_{SYS}(s) = H_{HBW}(s) \cdot H_{LBW}(s) \approx H_{LBW}(s) \quad (5.2)$$

The last approximation term in eq. (5.2) is based on the assumption that the response of the first CDR circuit 11 is very wide and flat. To derive the system's jitter tolerance, $J_{TOL\_SYS}(s)$ the input of $CDR_{\_LBW}$ first should be considered. The jitter tolerance of $CDR_{\_LBW}$, $J_{TOL\_LBW}(s)$, can be derived easily by using eq. (5.1 b). Finally, the system's jitter tolerance $J_{TOL\_SYS}(s)$ can be represented as following:

$$J_{TOL\_SYS}(s) = \frac{J_{TOL\_LBW}(s)}{H_{HBW}(s)} \quad (5.3)$$

According to eq. (5.3), it can be found that the bandwidth of the $CDR_{\_HBW}$ should be kept as small as possible so that the jitter tolerance can be increased dramatically. However, this is contrary to our previous assumption. In this embodiment, the first CDR circuit 11 $CDR_{\_HBW}$ should generate error-free and half-rate data to $CDR_{\_LBW}$. Therefore, the eq. (5.3) is valid only for $$J_{TOL\_HBW}(s) \geq J_{TOL\_SYS}(s) \quad (5.4),$$

where $J_{TOL\_HBW}(s)$ represents the jitter tolerance of $CDR_{\_HBW}$. To meet the eq. 5.4, the bandwidth of $CDR_{\_HBW}$ should be as higher as possible. Under this assumption, $CDR_{\_HBW}$ may be deemed an ideal multiplexer with nearly no disturbance on the data jitter.

Next, the $J_{TOL\_LBW}(s)$ can be derived according to eq. (5.1b). At the input of $CDR_{\_LBW}$, the input data have been demuxed into two half-rate ones. To avoid confusion, $J_{TOL\_LBW}(s)$ is represented as a non-normalized form for 5 Gbps demuxed data (10 Gbps input data)

$$J_{TOL\_LBW}(s) = \frac{200 \text{ ps}}{1 - H_{LBW}(s)} \quad (5.5)$$

By referring to the input by using eq. (5.3) and normalizing the system's jitter tolerance to the input data rate, the system's jitter tolerance can be defined as $$J_{TOL\_SYS}(s) = \frac{200 \text{ ps}}{H_{HBW}(s) \cdot (1 - H_{LBW}(s))} \quad (5.6)$$
$$= \frac{2}{H_{HBW}(s) \cdot (1 - H_{LBW}(s))}(UIpp)$$

Compared with conventional CDRs, the jitter tolerance is increased by a factor of two and the jitter transfer remains nearly unchanged. It is noticed that that the jitter tolerance can be improved by adopting another demuxed rate. For example, the numerator of eq. (5.6) changes to four if a quarter-rate architecture is adopted.

Figure 2:
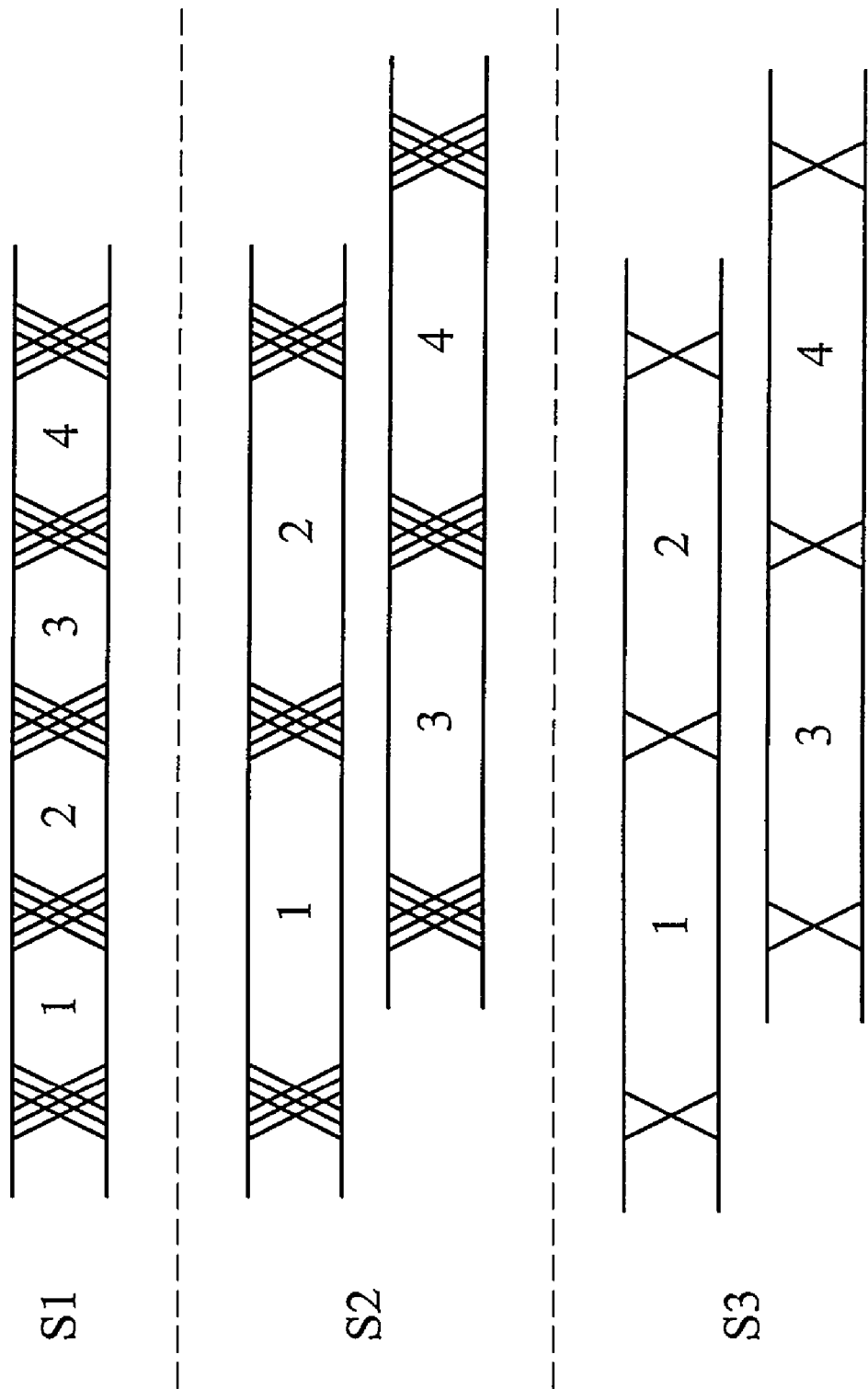
FIG. 2 is a schematic diagram of the output signals of the clock and data recovery circuit shown in FIG. 1.

FIG. 2 is a schematic diagram of the output signals of the clock and data recovery circuit shown in FIG. 1. Signal S1 represents a full rate input data. Signal S2 represents the signals separated by the first CDR circuit 11. It is noticed that the first CDR circuit 11 has a high bandwidth and the jitter of the first signal and the second signal still exists. Signal S3 shows the first signal and the second signal from the second CDR circuit 12 and the jitter of the first signal and the second signal has been reduced.

Figure 3:
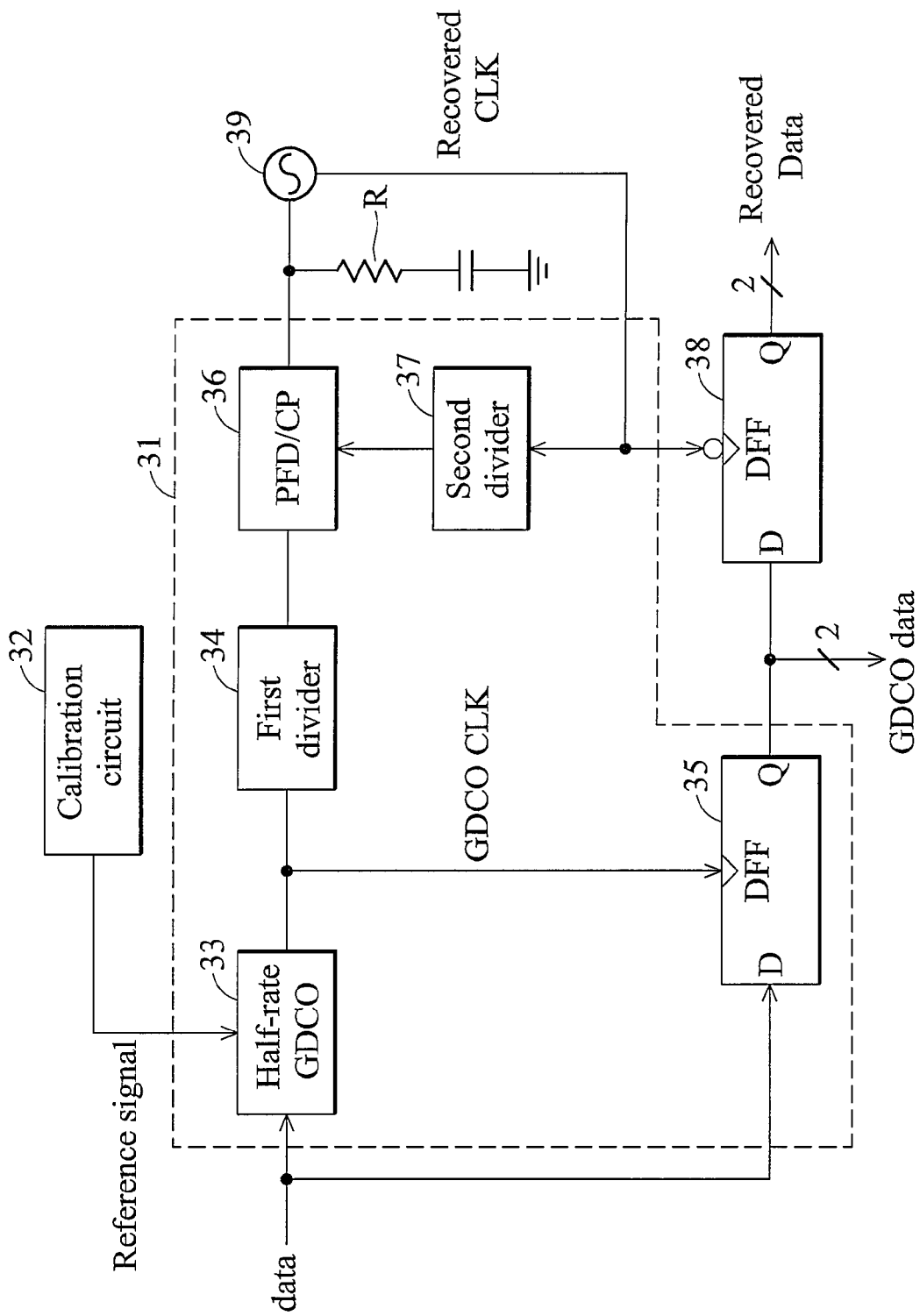
FIG. 3 is a schematic diagram of an embodiment of the proposed jitter-toleranced-enhanced CDR according to the invention.

FIG. 3 is a schematic diagram of an embodiment of the proposed jitter-tolerance-enhanced CDR according to the invention. The first CDR circuit 11 comprises a GDCO-based phase detector 31, a voltage controlled oscillator 39, a RC circuit and a D flip-flop 38. The FDCO-based phase detector 31 further comprises a half-rate gated digital-controlled oscillator (GDCO) 33, a D flip-flop 35, a first divider 34, a phase frequency detector and charging pump circuit (PFD/CP) 36, and a second divider 37. The GDCO 33 receives the reference signal and the data signal to generate a first clock signal. The voltage-controlled oscillator 39 receives a control voltage to generate a second clock signal. The phase frequency detector and charge pump circuit 36 receives the first clock signal and the second clock signal to generate the control voltage. The D flip-flop 35 comprises a first clock input terminal receiving the first clock signal, a first data input terminal receiving the data signal, and a first output terminal outputting a first output signal and a second output signal. The D flip-flop 38 comprises a second clock input terminal receiving the second clock signal, a second data input terminal coupled to the first data output terminal and a second data output terminal outputting the first signal and the second signal. The first divider 34 and the second divider 37 respectively divides the first clock signal and the second clock signal by N, wherein the first divider is coupled between the GDCO 33 and the PFD/CP 36 and the second divider is coupled between the voltage controlled oscillator 39 and the PFD/CP 36. In this embodiment, a GDCO is adapted and the reference signal is an N-bits code. In another embodiment, a gated voltage-controlled oscillator (GVCO) can be used for the first CDR circuit 11. Unlike a traditional phase detector, the proposed FDCO-based phase detector 31 provides an extracted clock rather than random data to the following low-bandwidth CDR loop, so the PFD can be used.

Figure 4:
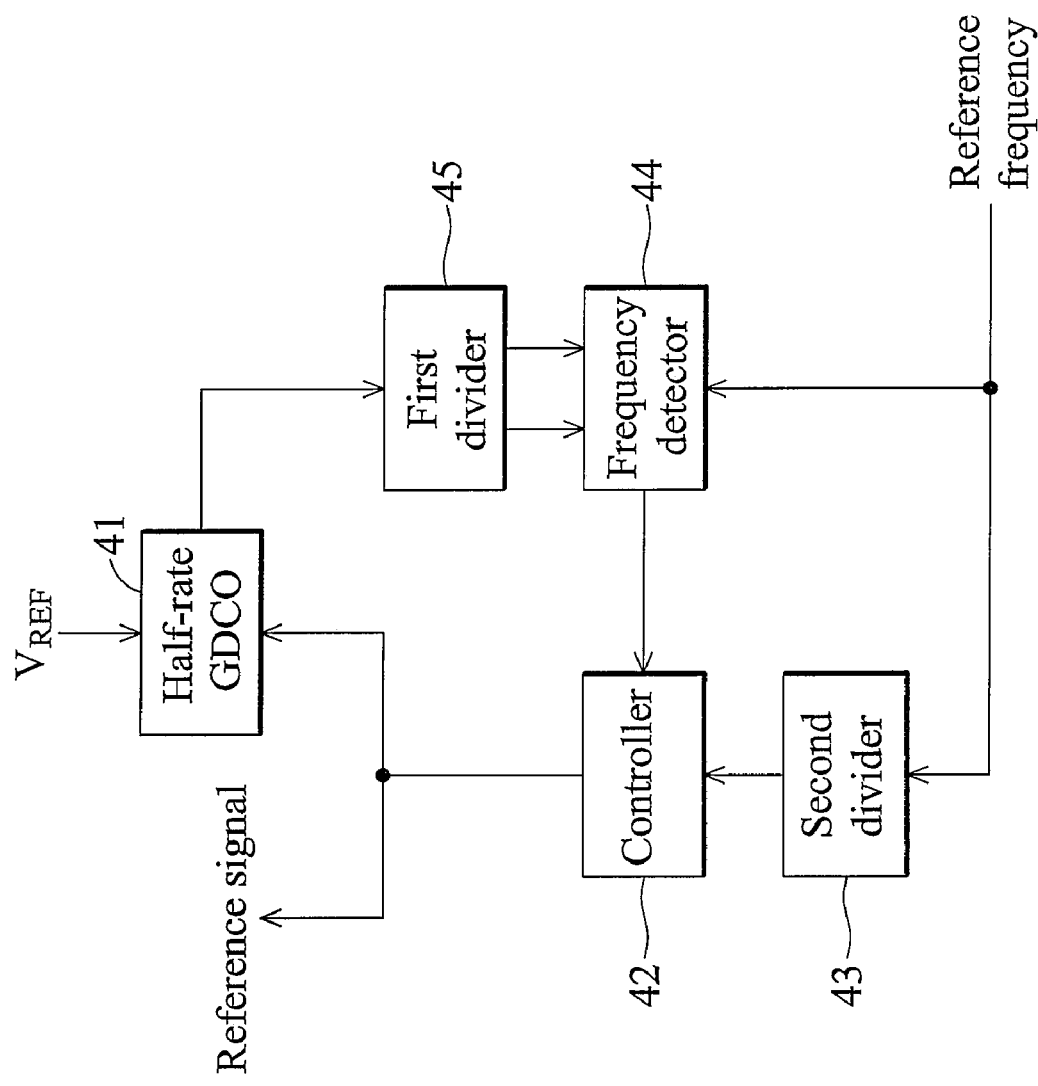
FIG. 4 is a block diagram of one embodiment of the calibration circuit according to the invention.

In this embodiment, the reference signal is generated by a calibration circuit 32. The detailed block diagram of one embodiment is shown in FIG. 4. The GDCO 41 is connected to a DC voltage ($V_{REF}$) and is served as a ring oscillator. The output of GDCO 41 is divided to a lower frequency by the first divider 45 and the output of the first divider 45 is compared with a reference frequency in a frequency detector 44. In one embodiment, the GDCO 41 duplicates the first clock signal. Then, the comparison result is fed to a controller 42, which may be a counter or a binary-searching unit, and the reference signal is updated according to the comparison result. In this embodiment, the controller 42 first outputs an initial control code to the GDCO 33 in FIG. 3 and the GDCO 41 and then updates the initial control code based on the comparison result. In this embodiment, the controller 42 can periodically update the control code.

The GDCO 33 is modeled as an all-pass transfer function and the detailed function of the GDCO is illustrated in the following description and figure. The second CDR circuit 12 locks to the GDCO CLK. Hence, the jitter transfer can be easily determined by the loop parameters. In this embodiment, the second CDR circuit 12 is similar to the conventional. In eq. (5.2), the jitter transfer of the CDR$_{HBW}$, $H_{HBW}(s)$, is 1 and the jitter transfer of the CDR$_{LBW}$, $H_{LBW}(s)$, is determined by the dividing ratio N, the values of the components in the loop filter comprising resistor R and capacitor C, the VCO gain $K_{VCO}$, and the current $I_{CP}$ in CP. The jitter transfer of the proposed CDR, $H_{SYS}(s)$ is described as following:

$$H_{SYS}(s) = H_{HBW}(s) \cdot H_{LBW}(s) \quad (5.7)$$
$$= \frac{I_{CP} \cdot (1 + s \cdot RC) \cdot K_{VCO} / C \cdot N}{s^2 + I_{CP} \cdot (1 + s \cdot RC) \cdot K_{VCO} / C \cdot N}$$

Figure 5:
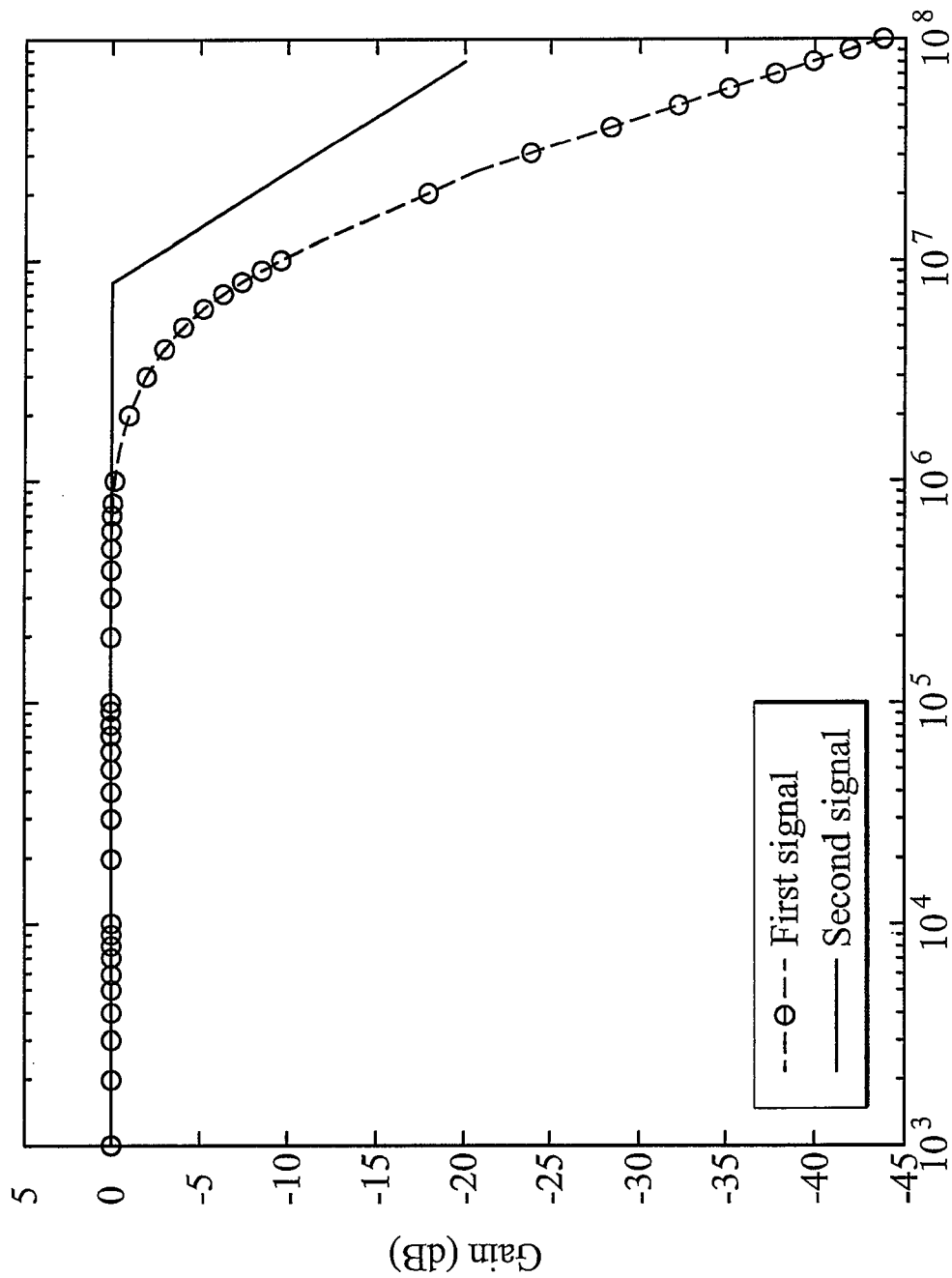
FIG. 5 is a simulation plot diagram of the proposed CDR.

In the disclosure, the proposed CDR as shown in FIG. 1 comprises the first CDR circuit 11 and the second CDR 12. Substituting the loop parameters (R=820 ohm, C=10 nF, N=4, $I_{CP}$=400 µA and $K_{VCO}$=260 MHz/volt) in eq. (5.7), the simulated jitter transfer is plotted in FIG. 5. The corner frequency of the jitter transfer is about 4 MHz and the jitter peaking is 0.05 dB, which pass SONET OC-192 specifications.

Figure 6:
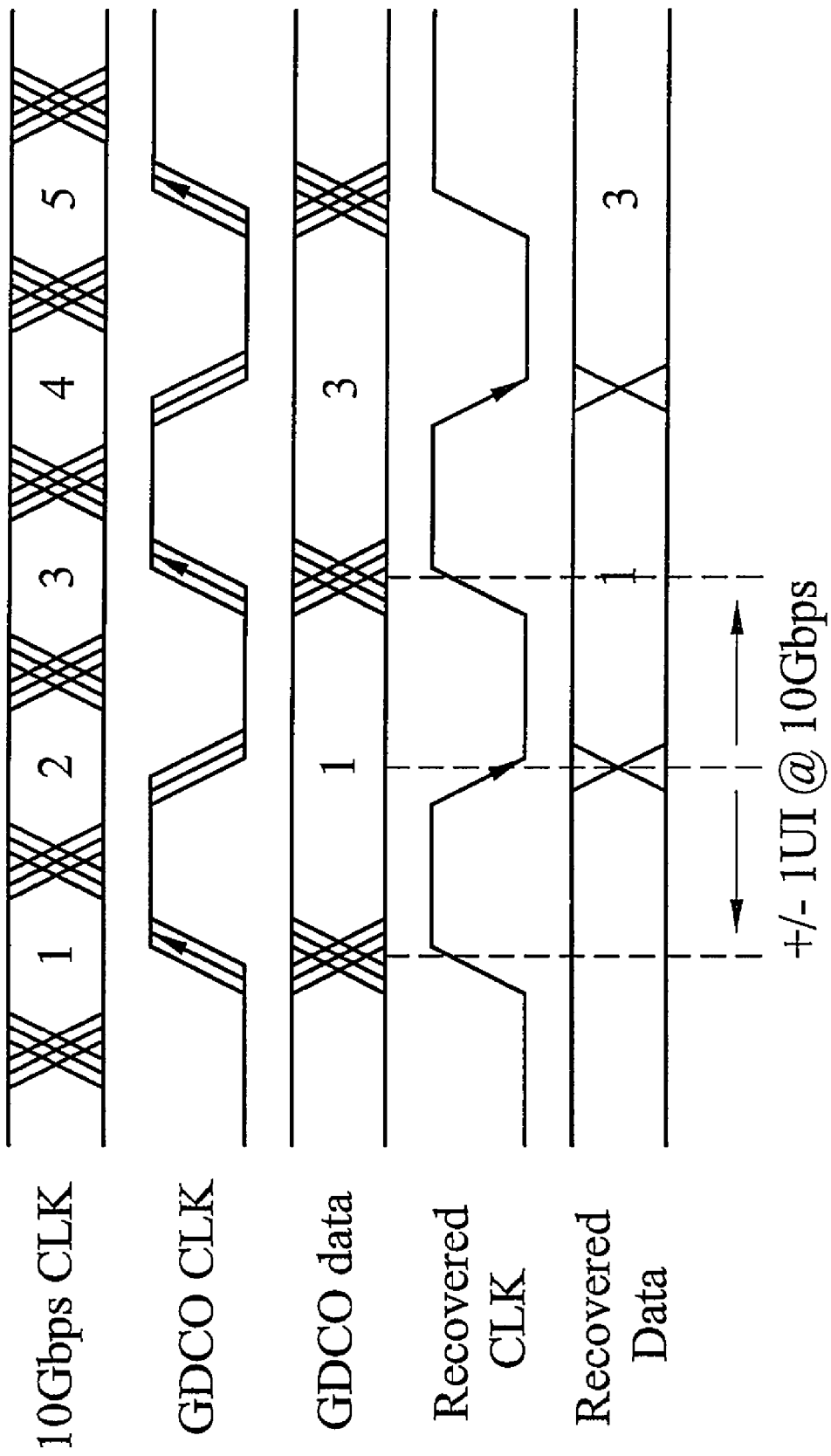
FIG. 6 is a schematic diagram of the jitter tolerance of the proposed CDR.

In the proposed CDR, limitations of jitter tolerance in traditional CDR circuits are relaxed. As shown in FIG. 6, because the GDCO demuxes the input data stream into two parallel error-free 5 Gb/s data, the main CDR's tracking range is extended to +/−1 UI. Furthermore, the PFD/CP combination and two divide-by-4 dividers extend the linear range of the GDCOPD to +/−8 UI, which guarantees the linear operation of the proposed CDR. Considering the all-pass characteristic of the GDCO and combining eqs. (5.6) and (5.7), the jitter tolerance of the proposed CDR, $J_{TOL\_SYS}(s)$ can be derived as $$J_{TOL\_SYS}(s) = \frac{2 \cdot (s^2 + I_{CP} \cdot (1 + s \cdot RC) \cdot K_{VCO} / C \cdot N)}{s^2} (UIpp) \quad (5.8)$$

The proposed CDR can provide the high-frequency jitter tolerance of 2 UIpp, which is twice as large as traditional results.

Figure 7:
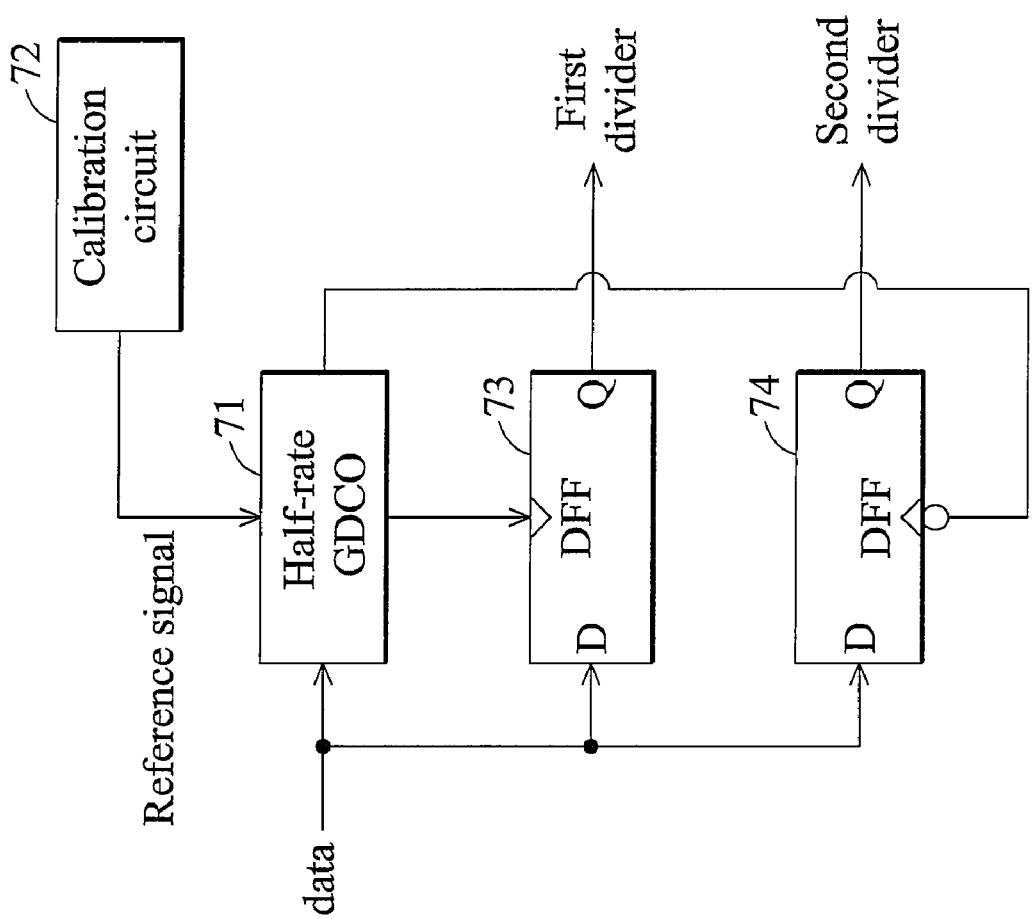
FIG. 7 is a block diagram of an embodiment of the first CDR in FIG. 1 according to the invention.

FIG. 7 is a block diagram of an embodiment of the first CDR in FIG. 1. The GDCO 71 receives a reference signal from the calibration circuit 72 and is served as a ring oscillator for providing clock signal to the first D flip-flop 73 and the second D flip-flop 74. In one embodiment, the GDCO 41 duplicates the first clock signal generated by the half-rate GDCO 33 in FIG. 3. The first D flip-flop 73 receives the data signal to output the first signal based on the clock signal. The second D flip-flop 74 receives the data signal to output the second signal based on the inverted clock signal. The description of the calibration circuit 72 can be referred to in the description of FIG. 4, and thus is not recited hereafter for briefly.

Figure 8:
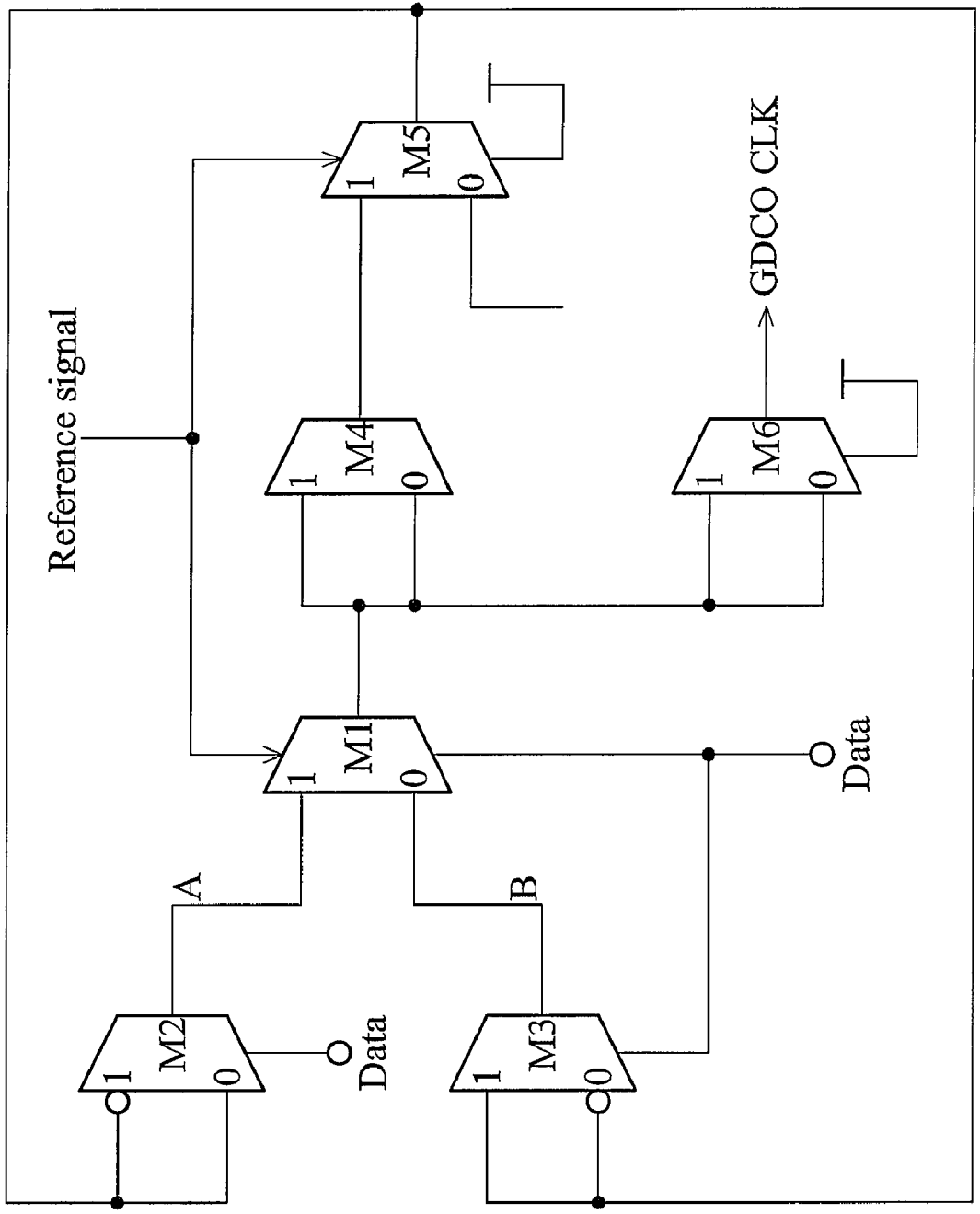
FIG. 8 is a block diagram of and embodiment of the gated digital-controlled oscillator according to the invention.

FIG. 8 is a block diagram of an embodiment of the gated digital-controlled oscillator according to the invention. The gated digital-controlled oscillator is composed of 5 gated multiplexers, M1-M5, and 1 replica buffer, M6. The fourth multiplexer M4 and fifth multiplexer M5 from an en-oscillating unit receiving the reference signal to output a first clock signal. The first multiplexer M1 receives the reference signal and comprises a first input terminal, a second input terminal and an output terminal coupled to the en-oscillating unit, wherein the output terminal outputs signal from the first input terminal or signal from the second input terminal based on the data signal. The second multiplexer M2 comprises a third input terminal receiving an inverted first clock signal, a fourth input terminal receiving the first clock signal, and an output terminal coupled to the first input terminal of the first multiplexer, wherein the output terminal outputs signal from the third input terminal or signal from the fourth input terminal based on the data signal. The third multiplexer M3 comprises a fifth input terminal receiving the first clock signal, a sixth input terminal receiving the inverted first clock signal, and an output terminal coupled to the second input terminal of the first multiplexer, wherein the output terminal outputs signal from the fifth input terminal or signal from the sixth input terminal based on the data signal.

The en-oscillating unit comprises a fourth multiplexer M4 and a fifth multiplexer M5. The fourth multiplexer comprises a seventh input terminal, an eighth input and an output terminal, wherein the seventh input terminal and an eighth input terminal are coupled to the output terminal of the first multiplexer M1. The fifth multiplexer M5 receives the reference signal and comprises a ninth input terminal coupled to the output terminal of the fourth multiplexer M4, a tenth input terminal grounded, and an output terminal outputting the first clock signal. The sixth multiplexer M6 comprises an eleventh input terminal and a twelfth input terminal coupled to the output terminal of the first multiplexer M1, and an output terminal outputting the first clock signal. When the input data is high, the multiplexers, M1, M2, M4, and M5 form an oscillator. The multiplexer, M3, outputs the clock B, which is the complement of the clock A. When the input data is low, the multiplexers, M1, M3, M4, and M5 form another oscillator. The multiplexer, M2, outputs the clock A. Once the input data changes, the clock A or B tracks the data.

Figure 9:
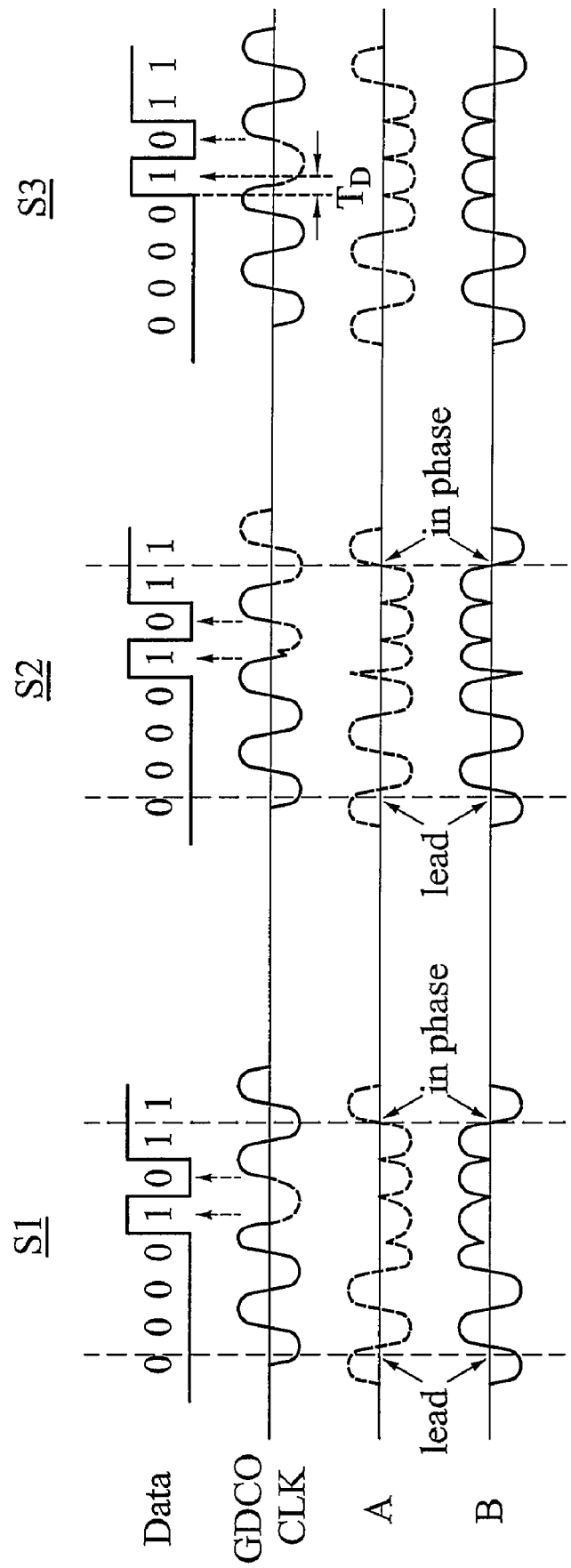
FIG. 9 illustrates how the proposed GDCO adjusts its output phase when the clocks lag, lead, and lock with the data, respectively.

FIG. 9 illustrates how the proposed GDCO adjusts its output phase when the clocks lag, lead, and lock with the data, respectively. In S1, when the signal GDCO CLK lags the signal Data, the clocks A and B change their polarity before the threshold voltage. It is equivalent to speed up the GDCO CLK to compensate for the lagged phase. Similarly, in S2, when the signal GDCO CLK leads the signal Data, the clocks A and B change after the threshold voltage to correct the phase. A timing diagram is shown in S3 for when the GDCO locks with the input data, The sampling time of GDCO CLK is determined by the time delay between data edges and GDCO CLK, $T_D$, and it can be approximated by the following equation:

$$T_D = \frac{180°}{N} \cdot 2 \quad (5.9)$$

where N is the effective number of stages when the GDCO is connected to a DC reference voltage. For example, if we connect the data input in FIG. 8 to a logical one, M1, M2, M4, and M5 form a 4-stage oscillator and N is 4 in this case. As a result, the GDCO CLK is delayed by 90° and samples at the middle of data interval.

In a conventional GVCO, oscillation starts when the input data is high and stops to be latched when the input data is low. Serious amplitude variation occurs if the output is latched to VDD or GND and this also slows down the speed of the oscillators. For the proposed GDCO in FIG. 8, the oscillating waveforms are never latched. Thus, the amplitude variation is reduced and the bandwidth requirement of the gated multiplexers is relaxed, too.

Figure 10:
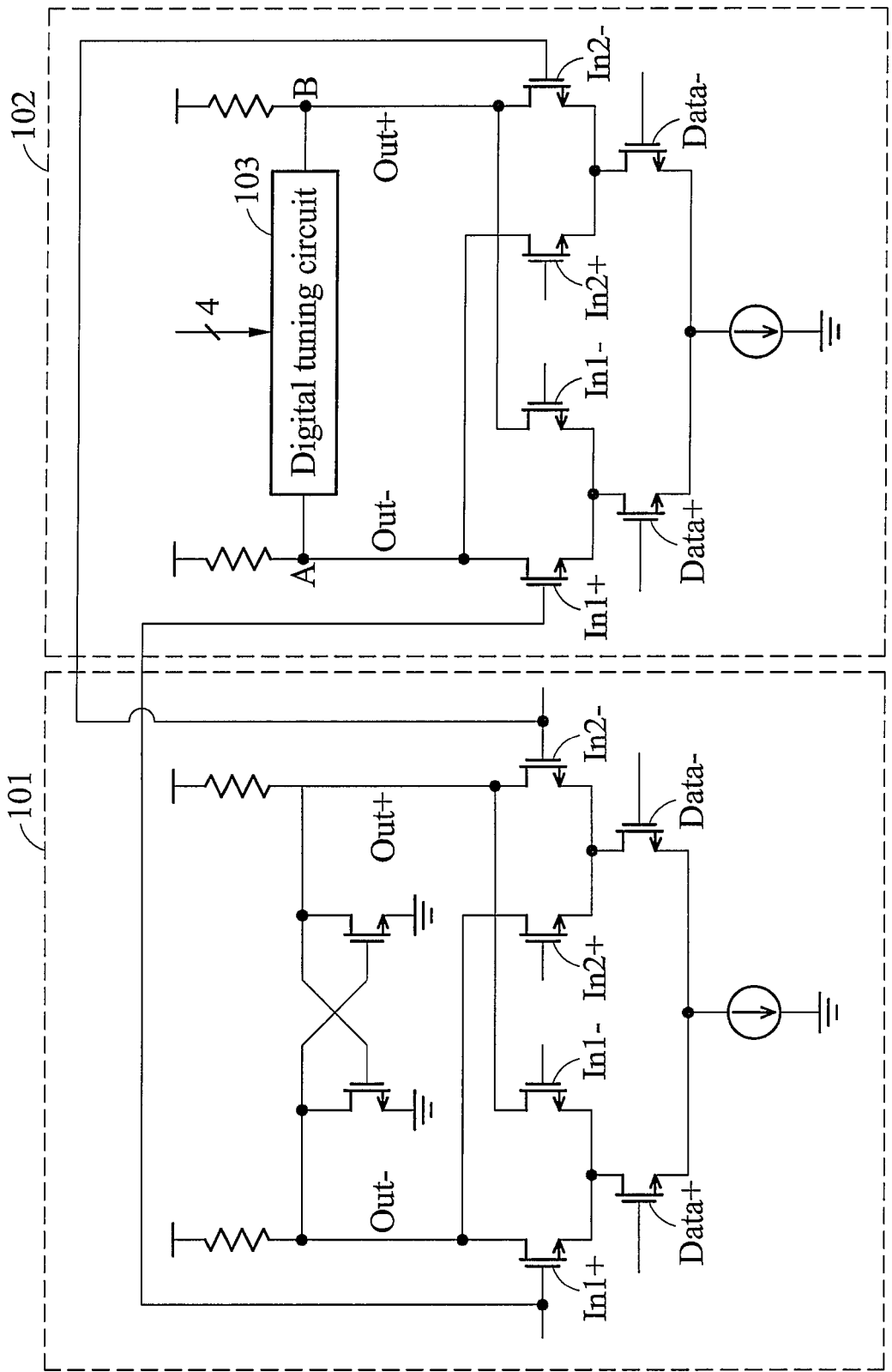
FIG. 10 is a diagram of building blocks for the gated digital-controlled oscillator shown in FIG. 8.
Figure 11:
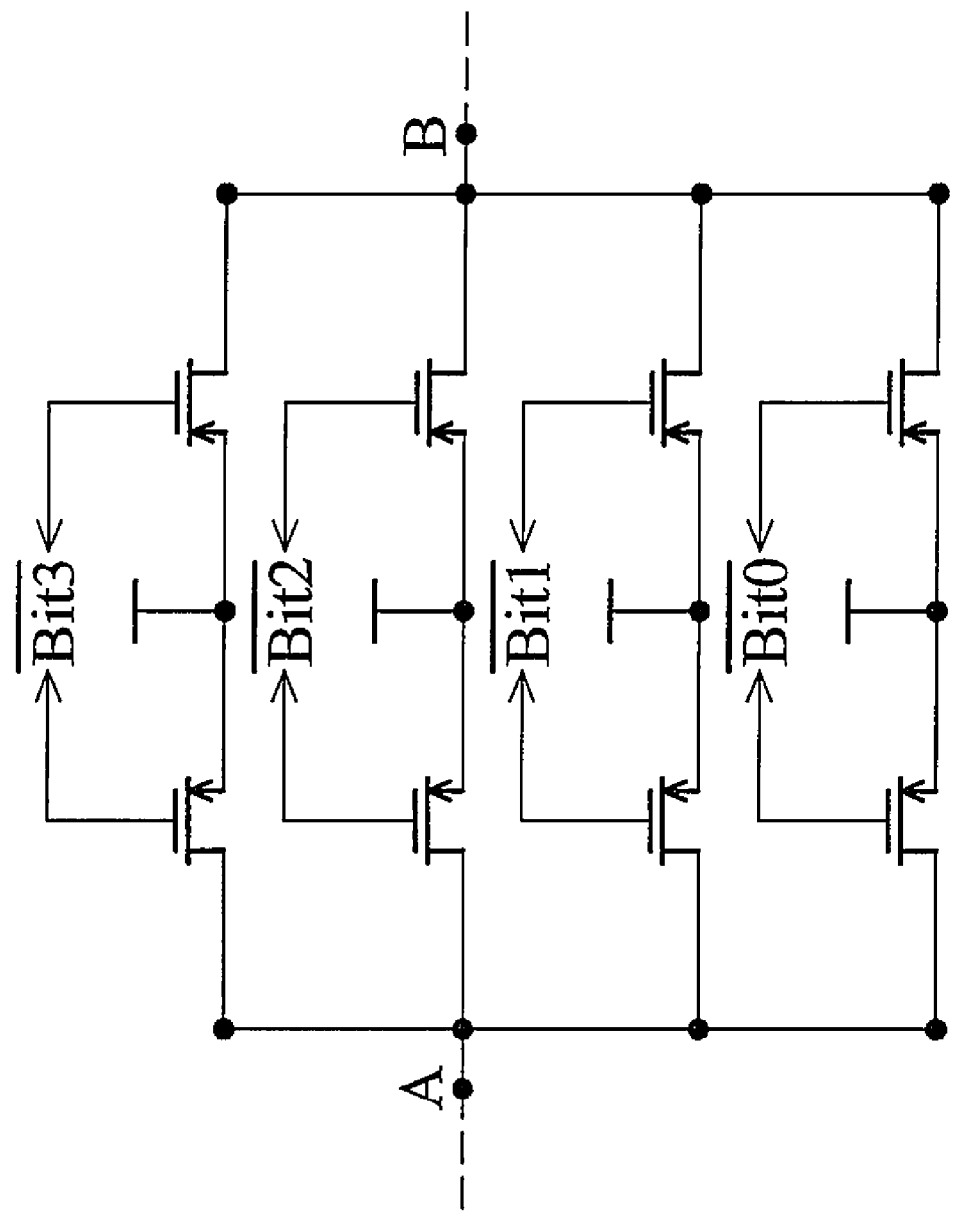
FIG. 11 is a circuit diagram of an embodiment of the 4-bit digital-controlled loadings.

FIG. 10 is a diagram of building blocks for the gated digital-controlled oscillator shown in FIG. 8. Multiplexers M2, M3, M4, and M6 form the first building block 101 and Multiplexers M1 and M5 form the second building block 102. The multiplexers M1-M6 are using the current-mode logics (CMLs). Additional cross-coupled pairs are added to M2, M3, M4, and M6 to ensure differential outputs. The inputs, Data+/−, in M1-M3 are used to select one of two differential inputs, in1+/− and in2+/−, respectively. The tail current source is also used to enhance the power supply rejection ratio. To overcome process variations, 4-bit digital-controlled loadings are used in M1 and M5. An embodiment of the 4-bit digital-controlled loadings is shown in FIG. 11. The embodiment of the invention provides quadrature matching in the GDCO while relieving the loading on nodes A and B, which require high bandwidth to achieve gating function. Based on simulation results, this 4-bit digital-controlled buffer ensures a tuning range of 600 MHz around 5 GHz with a monotonic frequency step no more than 50 MHz.

The GDCO's frequency independent jitter transfer is also simulated. In the simulation, a 10 Gbps $2^7-1$ PRBS with modulated jitter is applied at the GDCO's input. The jitter amplitude is set to 0.2 UIpp (20 ps pk-pk) and the jitter frequency ranges from 1 MHz to 100 MHz. The result is shown in Table 1 and no obvious frequency dependency is observed. Note that in this simulation the GDCO itself generates some high-frequency ISI jitter so the jitter transfer gain is higher. However, the high-frequency jitter can be filtered out by the following low-bandwidth CDR and the overall jitter peaking is not affected.

TABLE 1

Simulated jitter transfer of the GDCO

| Jitter frequency | GDCO's output jitter | Jitter transfer Gain |
| --- | --- | --- |
| 1 MHz | 23.6 ps (pk-pk) | 0.72 dB |
| 10 MHz | 23.4 ps (pk-pk) | 0.68 dB |
| 50 MHz | 23.6 ps (pk-pk) | 0.72 dB |
| 80 MHz | 23.5 ps (pk-pk) | 0.7 dB |
| 100 MHz | 23.3 ps (pk-pk) | 0.66 dB |

Figure 12:
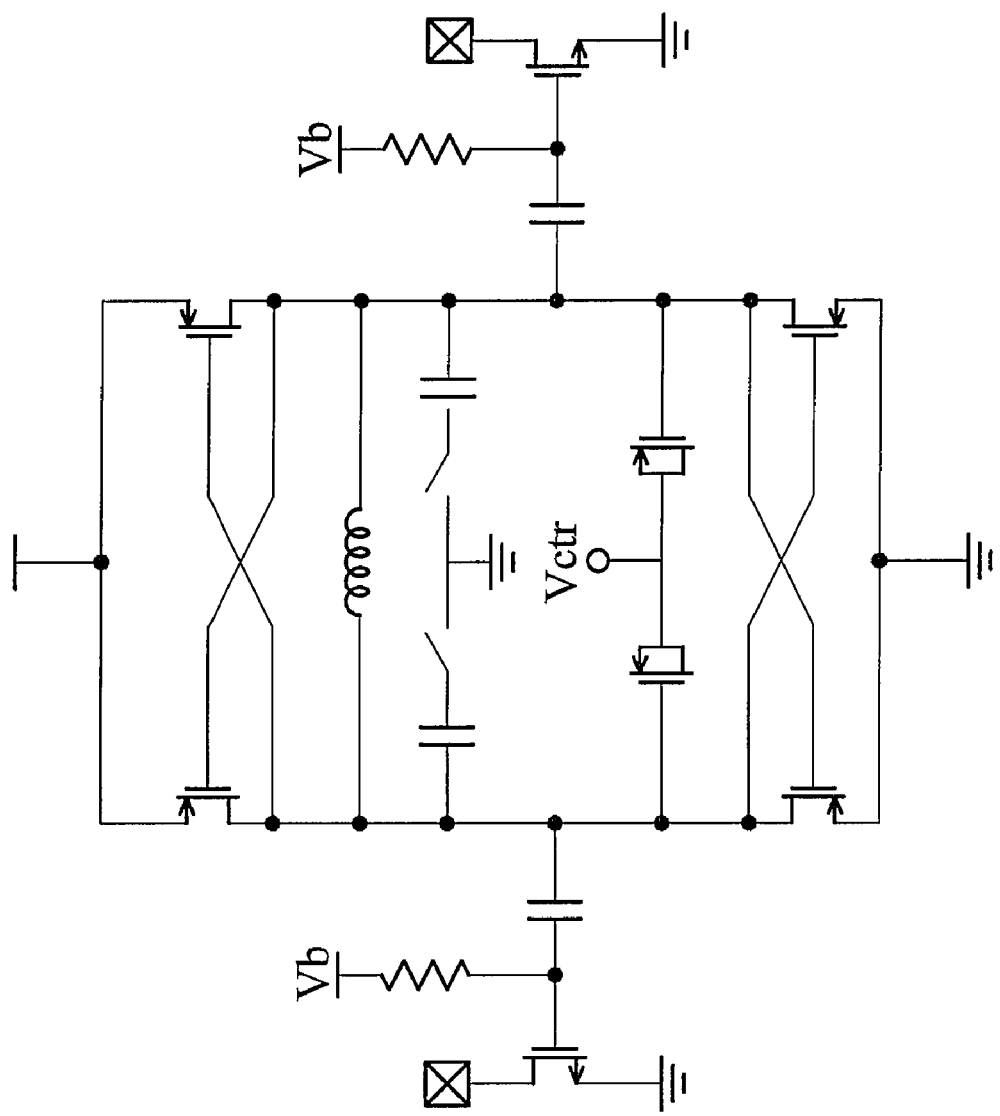
FIG. 12 is a circuit diagram of a voltage-controlled oscillator which adopts a complementary topology without a tail current source.

FIG. 12 is a circuit diagram of a voltage controlled oscillator which adopts a complementary topology without a tail current source. To have a wide-enough tunable frequency range and overcome process variations, a VCO with coarse and fine tunings are usually preferred. In this embodiment, one switched-capacitor and one set of accumulation-mode varactor are used to provide the frequency tuning. The VCO covers a frequency range from 4.62 to 5.14 GHz and has a VCO gain of 260 MHz/v. A symmetric inductor is also used to enhance the phase noise performance. The inductor has a value of 2.4 nH and exhibits a single-ended quality factor of 13 at 5 GHz. The current consumption of this VCO is less than 2 mA.

Figure 13:
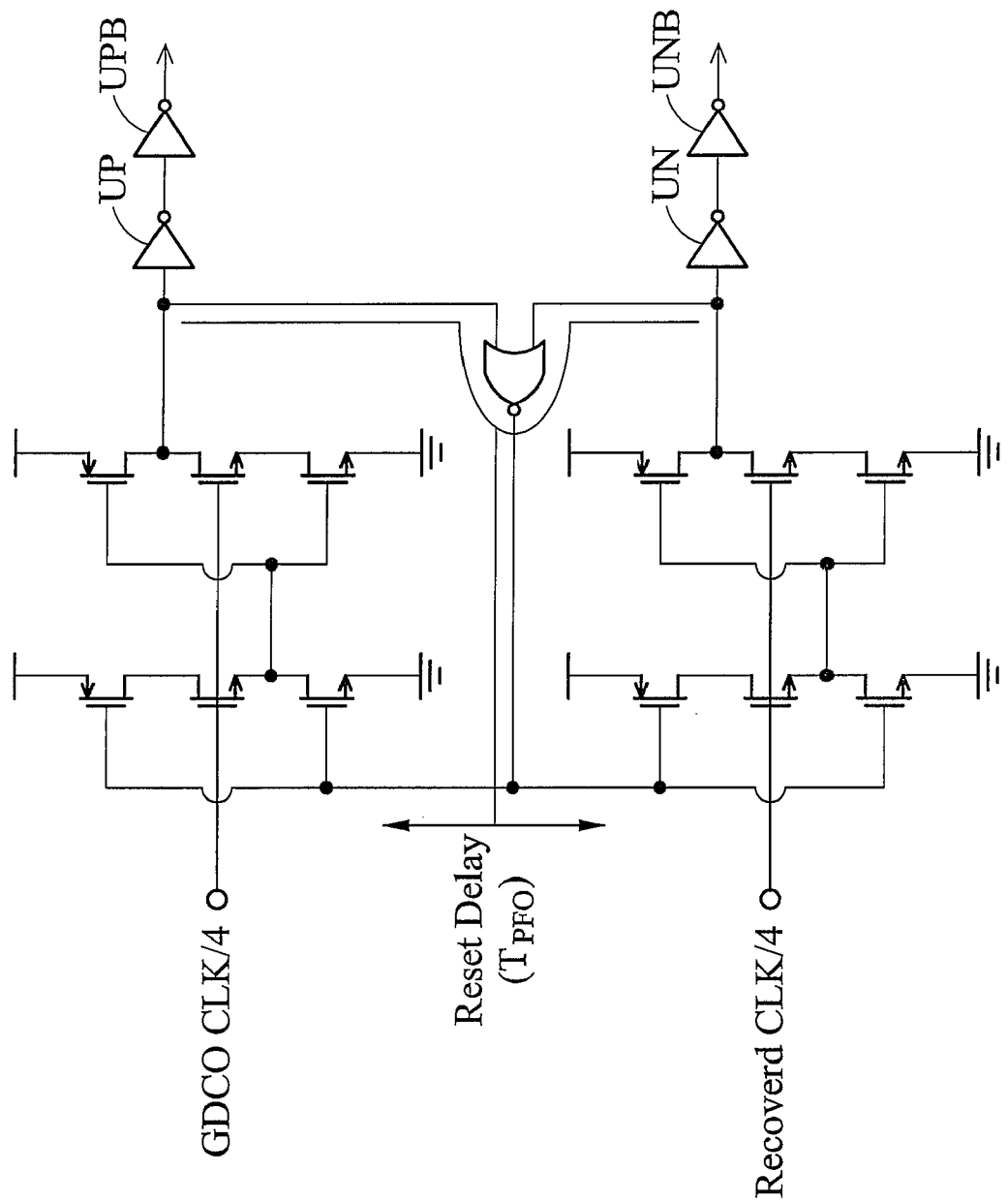
FIG. 13 is a circuit diagram of a phase frequency detector according to an embodiment of the invention.
Figure 14:
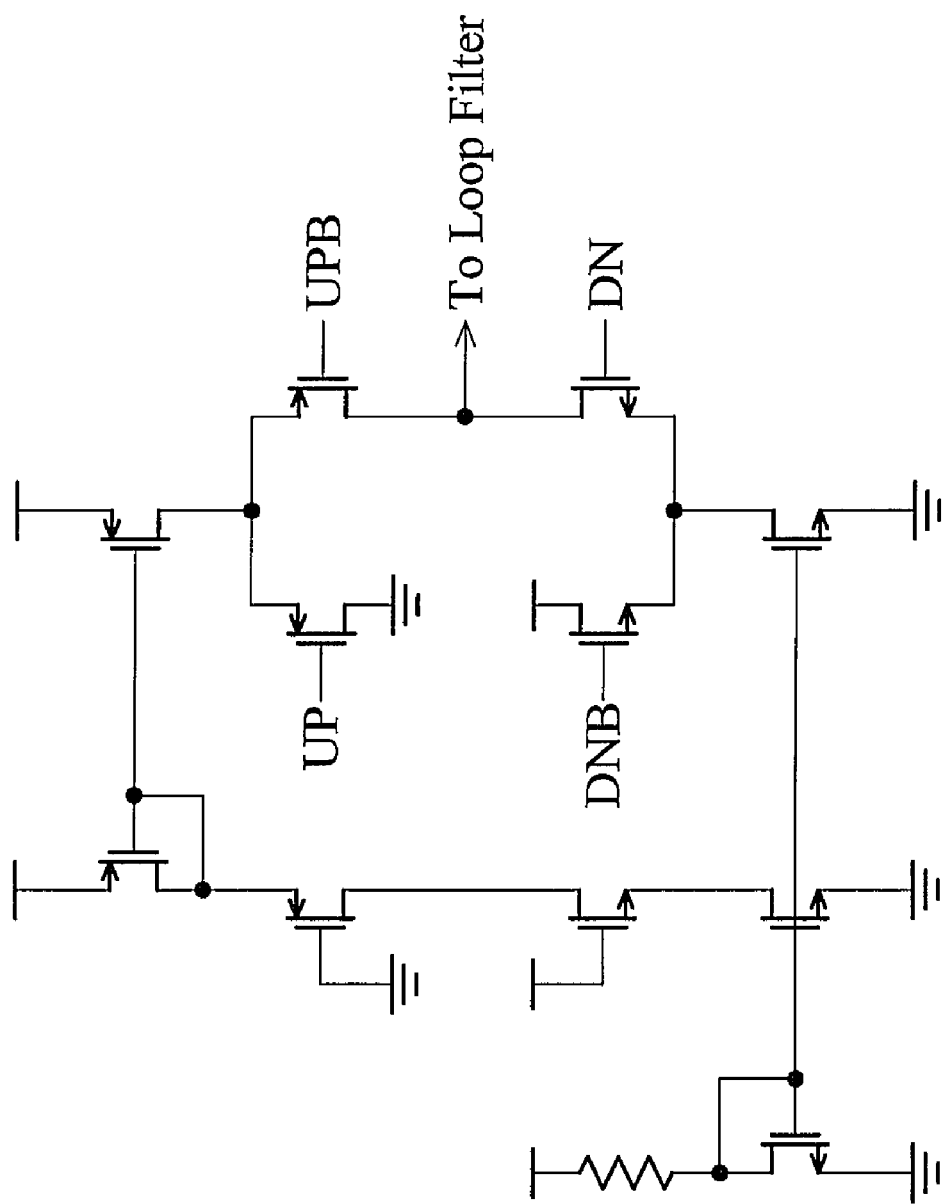
FIG. 14 is a circuit diagram of a charge pump according to an embodiment of the invention.

The output clocks of GDCO and VCO are both divided by 4 to 1.25 GHz and aligned at the inputs of the PFD. The schematics of PFD and CP are shown in FIGS. 13 and 14, respectively. To overcome the speed limitation, a dynamic logic style PFD is preferred. The feedback time of the PFD in FIG. 13, $T_{PFD}$, avoids the possible dead zone and reduces the jitter. The CP is also implemented with differential switching to operate at such a high speed. Note that the jitter tolerance is more susceptible to charge pump current mismatch in a linear CDR due to the lack of a high-gain phase detector. Assume the nominal value of the charge pump current is I and the current mismatch is ΔI. Also define the bit period of the 10 Gbps input as $T_{10Gb}$. Then the system's jitter tolerance shown in eq. (5.8) should be modified slightly as $$J_{TOL\_SYS}(s) = \left(1 - \frac{T_{PFD} \cdot \Delta I}{T_{10Gb} \cdot I}\right) \cdot \frac{2 \cdot (s^2 + I_{CP} \cdot (1 + s \cdot RC) \cdot K_{VCO}/C \cdot N)}{s^2} (UIpp) \quad (5.10)$$

According to eq. (5.10), it's necessary to keep both $T_{PFD}$ and ΔI as low as possible. As far as the feed back time in the PFD is concerned, the size of the feedback NOR gate is designed to make $T_{PFD}$ only large enough to avoid the dead zone problem. In this design, the $T_{PFD}$ is about 200 ps. Actually, some charge pump calibration techniques can be applied.

While the invention has been described by ways of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock and data recovery circuit, comprising:
a first clock and data recovery circuit receiving a data signal and a reference signal to demux the data signal into a first signal and a second signal, wherein the first signal and the second signal has a second data rate of X bps and the data signal has a first data rate of 2X bps, wherein the first clock and data recovery circuit comprises:
a half-rate gated controlled oscillator receiving the reference signal and the data signal to generate a first clock signal, wherein the first data rate of the data signal is 2X bps and the frequency of the first clock signal is X Hz;
a first D flip-flop comprising a first clock input terminal receiving the first clock signal, a first data input terminal receiving the data signal, and a first output terminal outputting the first signal; and
a second D flip-flop comprising a second clock input terminal receiving the inverted first clock signal, a second data input terminal receiving the data signal, and a second output terminal outputting the second signal; and
a second clock and data recovery circuit receiving and reducing the jitter in the first signal and the second signal to output a first recovery signal and a second recovery signal, wherein the bandwidth of the first clock and data recovery circuit is larger than the bandwidth of the second clock and data recovery circuit.

2. The circuit as claimed in claim 1, wherein the half-rate gated controlled oscillator receives the reference signal to generate a clock signal with frequency approximately to X Hz and the data signal calibrates and locks the frequency of the clock signal to X Hz.

3. A gated digital-controlled oscillator, comprising:
an en-oscillating unit receiving an initial code to output a clock signal;
a first multiplexer receiving the initial code, comprising a first input terminal, a second input terminal and an output terminal coupled to the en-oscillating unit, wherein the output terminal outputs signal from the first input terminal or signal from the second input terminal based on a data signal;
a second multiplexer comprising a third input terminal receiving an inverted clock signal, a fourth input terminal receiving the clock signal, and an output terminal coupled to the first input terminal of the first multiplexer, wherein the output terminal outputs signal from the third input terminal or signal from the fourth input terminal based on the data signal; and
a third multiplexer comprising a fifth input terminal receiving the clock signal, a sixth input terminal receiving the inverted clock signal, and an output terminal coupled to the second input terminal of the first multiplexer, wherein the output terminal outputs signal from the fifth input terminal or signal from the sixth input terminal based on the data signal.

4. The circuit as claimed in claim 3, wherein the en-oscillating unit comprises:
a fourth multiplexer comprising a seventh input and an eighth input terminal coupled to the output terminal of the first multiplexer, and an output terminal; and
a fifth multiplexer receiving the initial code and comprising a ninth input terminal coupled to the output terminal of the fourth multiplexer, and an output terminal outputting the first clock signal.

5. The circuit as claimed in claim 3, further comprising a buffer comprising a sixth multiplexer comprising an eleventh input terminal and a twelfth input terminal coupled to the output terminal of the first multiplexer, and an output terminal outputting the first clock signal.

6. The circuit as claimed in claim 3, wherein a data rate of the data signal is 2X bps and a frequency of the first clock signal is X Hz.

7. A clock and data recovery circuit receiving a data signal with a data rate of 2X bps, comprising:
a first clock and data recovery circuit receiving the data signal and an initial control code to separate the data signal into a first signal and a second signal, comprising:
a gated digital-controlled oscillator receiving the initial control code to generate a clock signal; and
a data separating unit to separate the data signal into the first signal and the second signal based on the clock signal, wherein a second data rate of the first signal and the second signal is half of a first data rate of the data signal;
a calibration circuit to generate control code based on the clock signal and a reference clock signal; and
a second clock and data recovery circuit receiving and reducing jitter in the first signal and the second signal to output a first recovery signal and a second recovery signal.

8. The circuit as claimed in claim 7, wherein the gated digital-controlled oscillator receives the initial control code to generate the clock signal with frequency approximately to X Hz and the data signal calibrates and locks the frequency of the clock signal to X Hz.

9. The circuit as claimed in claim 7, wherein the calibration circuit comprises:
an oscillator to output a clock signal;
a frequency detector receiving the clock signal and the reference clock signal to output a comparison result; and
a controller receiving the comparison result to generate the control code and the initial control code being updated by the control code.

10. The circuit as claimed in claim 7, wherein the gated digital-controlled oscillator comprises:
an en-oscillating unit receiving an initial code to output the clock signal;
a first multiplexer receiving the initial code, comprising a first input terminal, a second input terminal and an output terminal coupled to the en-oscillating unit, wherein the output terminal outputs signal from the first input terminal or signal from the second input terminal based on the data signal;
a second multiplexer unit comprising a third input terminal receiving an inverted clock signal, a fourth input terminal receiving the clock signal, and an output terminal coupled to the first input terminal of the first multiplexer, wherein the output terminal outputs signal from the third input terminal or signal from the fourth input terminal based on the data signal; and
a third multiplexer unit comprising a fifth input terminal receiving the clock signal, a sixth input terminal receiving the inverted clock signal, and an output terminal coupled to the second input terminal of the first multiplexer, wherein the output terminal outputs signal from the fifth input terminal or signal from the sixth input terminal based on the data signal.

11. The circuit as claimed in claim 10, wherein the en-oscillating unit comprises:
- a fourth multiplexer comprising a seventh input and an eighth input terminal coupled to the output terminal of the first multiplexer, and an output terminal; and
- a fifth multiplexer receiving the initial code and comprising a ninth input terminal coupled to the output terminal of the fourth multiplexer, and an output terminal outputting the first clock signal.

12. The circuit as claimed in claim 10, further comprising a buffer comprising a sixth multiplexer comprising an eleventh input terminal and a twelfth input terminal coupled to the output terminal of the first multiplexer, and an output terminal outputting the first clock signal.

13. The circuit as claimed in claim 1, further comprising a multiplexer receiving the first recovery signal and the second recovery signal to output a recovery data signal.

14. The circuit as claimed in claim 1, wherein the first clock and data recovery circuit further comprises:
- a voltage controlled oscillator receiving a control voltage to generate a second clock signal; and
- a phase frequency detector and charging pump circuit receiving the first clock signal and the second clock signal to generate the control voltage on a loop filter.

15. The circuit as claimed in claim 14, further comprising a first divider and a second divider respectively dividing the first clock signal and the second clock signal by N, wherein the first divider is coupled between the half-rate gated controlled oscillator and the phase frequency detector and charging pump circuit and the second divider is coupled between the voltage controlled oscillator and the phase frequency detector and charging pump circuit.

16. The circuit as claimed in claim 14, further comprising:
- a resistor having a first terminal coupled between the voltage controlled oscillator and the phase frequency detector and charging pump circuit, and a second terminal;
- a capacitor having a third terminal coupled to the second terminal of the resistor, and a fourth terminal grounded.

17. The circuit as claimed in claim 1, further comprising a calibration circuit to generate the reference signal, wherein the calibration circuit comprises:
- an oscillator to duplicate and output the first clock signal generated by the half-rate gated controlled oscillator;
- a frequency detector receiving the first clock signal and a reference signal to output a comparison result; and
- a controller receiving the comparison result to generate the reference signal.

18. The circuit as claimed in claim 17, wherein when the half-rate gated controlled oscillator is a gated digital-controlled oscillator, the reference signal is a N-bits code, and when the half-rate gated controlled oscillator is a gated voltage-controlled oscillator, the reference signal is a reference voltage.

19. The circuit as claimed in claim 1, further comprising a calibration circuit to generate the reference signal, wherein the calibration circuit comprises:
- an oscillator to output a clock signal;
- a frequency detector receiving the clock signal and a reference clock signal to output a comparison result; and
- a controller receiving the comparison result to generate the reference signal.

20. The circuit as claimed in claim 1, wherein the half-rate gated controlled oscillator comprises:
- an en-oscillating unit receiving the reference signal to output the first clock signal;
- a first multiplexer receiving the reference signal, comprising a first input terminal, a second input terminal and an output terminal coupled to the en-oscillating unit, wherein the output terminal outputs signal from the first input terminal or signal from the second input terminal based on the data signal;
- a second multiplexer comprising a third input terminal receiving an inverted first clock signal, a fourth input terminal receiving the first clock signal, and an output terminal coupled to the first input terminal of the first multiplexer, wherein the output terminal outputs signal from the third input terminal or signal from the fourth input terminal based on the data signal; and
- a third multiplexer comprising a fifth input terminal receiving the first clock signal, a sixth input terminal receiving the inverted first clock signal, and an output terminal coupled to the second input terminal of the first multiplexer, wherein the output terminal outputs signal from the fifth input terminal or signal from the sixth input terminal based on the data signal.

21. The circuit as claimed in claim 20, wherein the en-oscillating unit comprises:
- a fourth multiplexer comprising a seventh input terminal and an eighth input terminal coupled to the output terminal of the first multiplexer, and an output terminal; and
- a fifth multiplexer receiving the reference signal and comprising a ninth input terminal coupled to the output terminal of the fourth multiplexer, a tenth input terminal grounded, and an output terminal outputting the first clock signal.

22. The circuit as claimed in claim 20, further comprising a buffer comprising a sixth multiplexer comprising an eleventh input terminal and a twelfth input terminal coupled to the output terminal of the first multiplexer, and an output terminal outputting the first clock signal.

23. The circuit as claimed in claim 1, wherein when the half-rate gated controlled oscillator is a gated digital-controlled oscillator, the reference signal is an N-bits code, and when the half-rate gated controlled oscillator is a gated voltage-controlled oscillator, the reference signal is a reference voltage.

* * * * *